(12) United States Patent
Kelly et al.

(10) Patent No.: US 9,716,065 B2
(45) Date of Patent: Jul. 25, 2017

(54) VIA BOTTOM STRUCTURE AND METHODS OF FORMING

(71) Applicant: International Business Machines Corporation, Armonk, NY (US)

(72) Inventors: James J. Kelly, Schenectady, NY (US); Takeshi Nogami, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/853,131

(22) Filed: Sep. 14, 2015

(65) Prior Publication Data

US 2017/0077037 A1    Mar. 16, 2017

(51) Int. Cl.
| H01L 23/52 | (2006.01) |
| H01L 23/532 | (2006.01) |
| H01L 23/522 | (2006.01) |
| H01L 21/768 | (2006.01) |

(52) U.S. Cl.
CPC .. *H01L 23/53238* (2013.01); *H01L 21/76802* (2013.01); *H01L 21/76834* (2013.01); *H01L 21/76843* (2013.01); *H01L 21/76867* (2013.01); *H01L 21/76879* (2013.01); *H01L 23/5226* (2013.01)

(58) Field of Classification Search
CPC .................................................. H01L 23/5226
USPC ....................................................... 257/751
See application file for complete search history.

(56) References Cited

U.S. PATENT DOCUMENTS

| 6,457,234 | B1 | 10/2002 | Edelstein et al. |
| 6,779,711 | B2 | 8/2004 | Edelstein et al. |
| 7,081,680 | B2 | 7/2006 | Edelstein et al. |
| 7,795,155 | B2 | 9/2010 | McGlashan-Powell et al. |
| 7,846,841 | B2 | 12/2010 | Ishizaka et al. |
| 8,294,270 | B2 | 10/2012 | Edelstein et al. |
| 8,404,145 | B2 | 3/2013 | McGlashan-Powell et al. |
| 2002/0036143 | A1* | 3/2002 | Segawa ............... C23C 18/1664 205/187 |
| 2009/0072406 | A1* | 3/2009 | Yang ................. H01L 21/76843 257/761 |
| 2009/0218691 | A1* | 9/2009 | Yang ................. H01L 21/76805 257/751 |
| 2010/0295181 | A1* | 11/2010 | Yang ................. H01L 21/76843 257/751 |
| 2013/0075908 | A1* | 3/2013 | Cabral, Jr. ........ H01L 23/53238 257/751 |

* cited by examiner

*Primary Examiner* — Sitaramarao S Yechuri
(74) *Attorney, Agent, or Firm* — Catherine Ivers; Hoffman Warnick LLC

(57) ABSTRACT

Various embodiments include methods and integrated circuit structures. One method includes: forming a via opening through a trench to expose a portion of an underlying metal line; electrolessly plating a metal layer at a bottom of the via opening over the exposed portion of the underlying metal line, the electrolessly plated metal layer formed of a metal not including copper; depositing a cobalt layer to cover the bottom of the via opening over the electrolessly plated metal layer and sidewalls of the via opening; and growing a copper layer over the cobalt layer to form a line within the trench and a via filling the via opening.

17 Claims, 15 Drawing Sheets

VIA BOTTOM STRUCTURE AND METHODS OF FORMING

BACKGROUND

The subject matter disclosed herein relates to integrated circuit devices. More particularly, the subject matter relates to via structures in integrated circuit devices.

As integrated circuit (IC) technologies have advanced, the size of these devices has correspondingly decreased. In particular, as devices are reduced in scale to comply with ever-smaller packaging, tighter constraints are applied to their dimensions and spacings.

As device dimensions are reduced, the line resistance and via resistance within an IC can increase, causing signal propagation delays, and reduced performance of that IC. Copper (Cu) interconnects, in particular, can cause resistance issues as device dimensions shrink, because the thickness of the Cu layer is proportionally larger than its corresponding diffusion barrier layer (e.g., tantalum nitride, TaN). The thinner barrier layer, particularly at the bottom of vias, can fail to effectively prevent electromigration, a significant cause of failure in ICs.

SUMMARY

Various embodiments include methods of forming integrated circuit (IC) structures, and the structures formed by such methods. Various methods can include: forming a via opening through a trench to expose a portion of an underlying metal line; electrolessly plating a metal layer at a bottom of the via opening over the exposed portion of the underlying metal line, the electrolessly plated metal layer formed of a metal not including copper; depositing a cobalt layer to cover the bottom of the via opening over the electrolessly plated metal layer and sidewalls of the via opening; and growing a copper layer over the cobalt layer to form a line within the trench and a via filling the via opening.

A first aspect includes a method including: forming a via opening through a trench to expose a portion of an underlying metal line; electrolessly plating a metal layer at a bottom of the via opening over the exposed portion of the underlying metal line, the electrolessly plated metal layer formed of a metal not including copper; depositing a cobalt layer to cover the bottom of the via opening over the electrolessly plated metal layer and sidewalls of the via opening; and growing a copper layer over the cobalt layer to form a line within the trench and a via filling the via opening.

A second aspect includes a method including: forming a via opening through a trench to expose a portion of an underlying metal line; electrolessly plating a metal layer at a bottom of the via opening over the exposed portion of the underlying metal line, the electrolessly plated metal layer formed of a metal not including copper; depositing a diffusion barrier layer to cover the bottom of the via opening over the electrolessly plated metal layer and sidewalls of the via opening; and growing a copper layer over the diffusion barrier layer to form a line within the trench and a via filling the via opening.

A third aspect includes an integrated circuit (IC) structure having: a liner layer including silicon; a copper wire within the liner layer; a dielectric layer over the copper wire and the liner layer; a wire within the dielectric layer; a via extending between the wire and the copper wire within the dielectric layer, the via having a lining along corresponding sidewalls; and an electrolessly plated barrier layer proximate a bottom of the via contacting the copper wire within the liner layer, the electrolessly plated barrier layer including metal ions from at least one of gold (Ag), platinum (Pt), Ruthenium (Ru), tin (Sn), palladium (Pd), rhodium (Rh), iridium (Ir), indium (In), osmium (Os) or rhenium (Re).

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
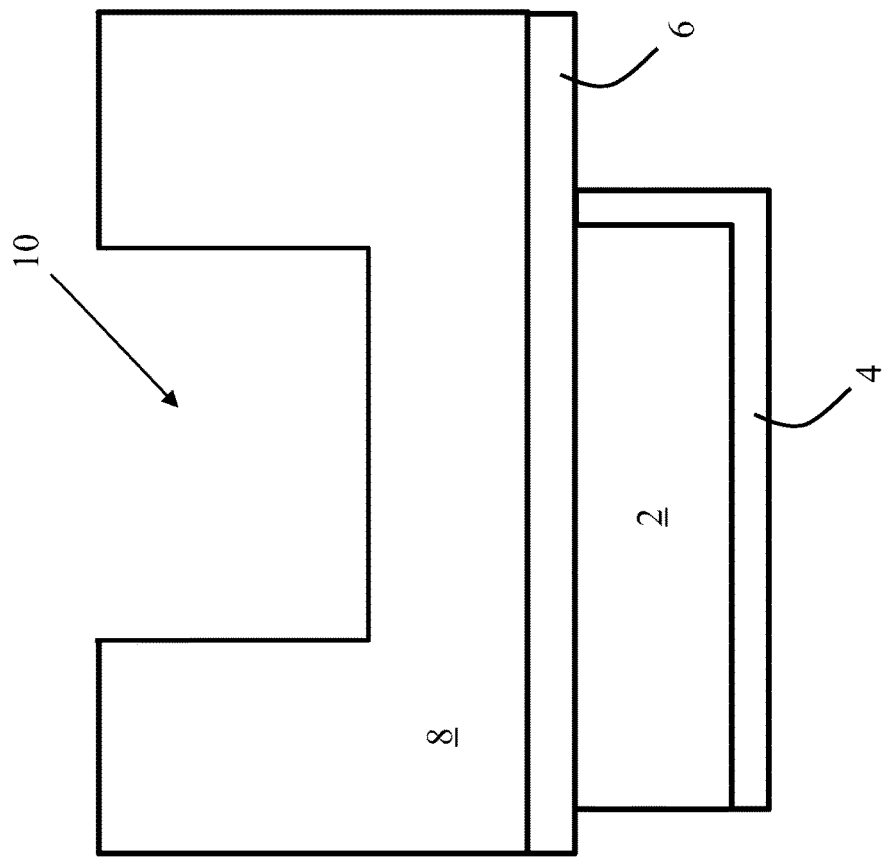
FIG. 1 shows a schematic cross-sectional depiction of a precursor structure according to various embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuit (IC) devices. More particularly, the subject matter relates to via structures in integrated circuit devices.

According to various embodiments, methods include electroplating a via structure using copper (Cu) atoms, which are ionized to form Cu ion, and subsequently depositing at least one distinct metal atom (e.g., gold (Ag), platinum (Pt), Ruthenium (Ru), tin (Sn), palladium (Pd), rhodium (Rh), iridium (Ir), indium (In), osmium (Os), rhenium (Re), etc.) over the ionized Cu in order to form an electromigration barrier layer. In particular, these processes can be performed proximate the bottom of the via structure. The at least one distinct metal atom can have an ionization tendency that is less than Cu, meaning that deposition of this at least one distinct metal takes place by electron transfer from Cu to (the particular type of) metal ion, making deposition selectivity nearly exact.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

As described herein, "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

FIGS. 1-13 show schematic cross-sectional depictions of integrated circuit structures (and precursor structures) that illustrate processes performed according to various embodiments. It is understood that the processes outlined herein may be performed in a different order than described in some embodiments. Additionally, not all of the processes outlined herein need necessarily be performed according to various embodiments.

Turning to FIG. 1, a cross-sectional view of a precursor structure is shown. The precursor structure can include a metal line 2, at least partially surrounded by a liner 4 (e.g., tantalum nitride (TaN), tantalum (Ta), titanium nitride (TiN), titanium (Ti), cobalt (Co), ruthenium (Ru), or manganese silicate ($MnSiO_3$)), which may be formed by conventional physical vapor deposition (PVD) techniques, or TaN deposited using conventional atomic layer deposition (ALD) techniques. In various embodiments, metal line 2 is formed of copper (Cu). Over metal line 2 and liner 4 is a dielectric layer 6, e.g., Nblok, and over the dielectric is a low K dielectric layer 8 (e.g., SiCOH, or other low-K dielectric material). A trench 10 has been formed in the low K dielectric layer 8 in this precursor structure, for example, by conventional etching approaches known in the art.

Figure 2:
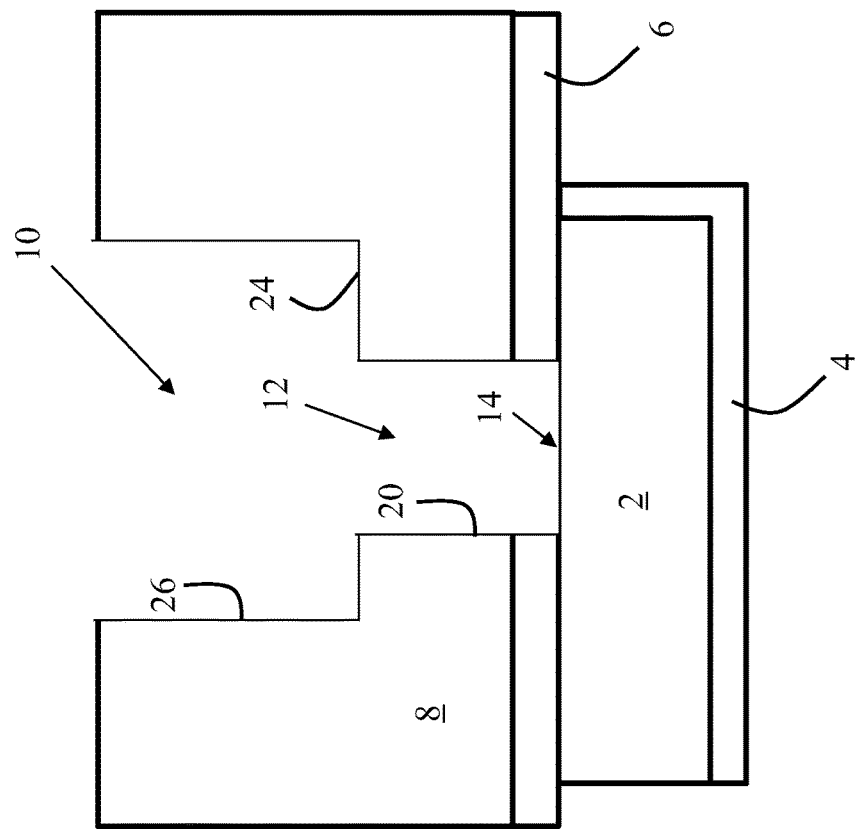
FIG. 2 shows a schematic cross-sectional depiction of a structure undergoing a process according to various embodiments.

FIG. 2 shows a first process according to various embodiments, including forming a via opening 12 through the trench 10 (in precursor layer) to expose a portion 14 of the underlying metal line 2. The via opening 12 can be formed by conventional dual-damascene etching, including, for example, reactive ion etching (RIE). The via opening 12 can extend through dielectric layer 6.

Figure 3:
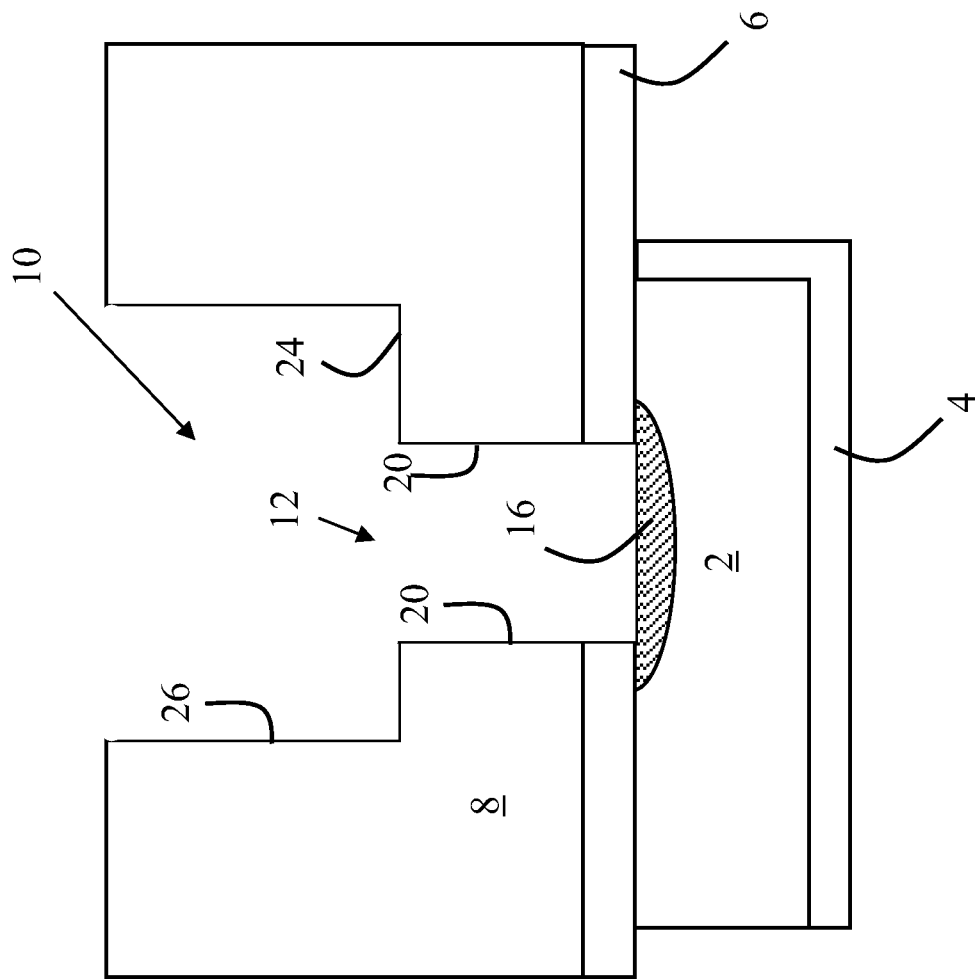
FIG. 3 shows a schematic cross-sectional depiction of a structure undergoing a process according to various embodiments.

FIG. 3 shows another process according to various embodiments, including electrolessly plating a metal layer 16 at a bottom of via opening 12, over the exposed portion 14 of metal line 2. In various embodiments, metal layer 16 is formed of a metal not including Cu. In particular cases, metal layer 16 is electrolessly plated over only the exposed portion 14 of underlying metal line 2. That is, metal layer 16 can include metal atoms from at least one of gold (Ag), platinum (Pt), Ruthenium (Ru), tin (Sn), palladium (Pd), rhodium (Rh), iridium (Ir), indium (In), osmium (Os) or rhenium (Re), plated as metal ions over exposed portion 14 of metal line 2. Regardless of which particular metal(s) is chosen as metal layer 16, these metal(s) have an ionization tendency below an ionization tendency of Cu, whereby the electrolessly plated metal layer 16 is formed over exposed portion 14 of metal line 2 by electron transfer from the Cu to the electrolessly plated metal layer 16. This electron transfer from Cu to metal layer 16 results in an approximately exactly selective deposition of metal layer 16 over only metal line 2 (Cu). It is known in the art that Sn is less noble than Cu (metal line 2), and as such, may seem an unlikely material for metal layer 16 (which is deposited over metal line 2). However, according to various embodiments, metal layer 16 is formed of Sn, and Applicants have found that in the presence of certain complexing agents that have an affinity for Cu, the Sn can displace Cu according the processes described herein.

Figure 4:
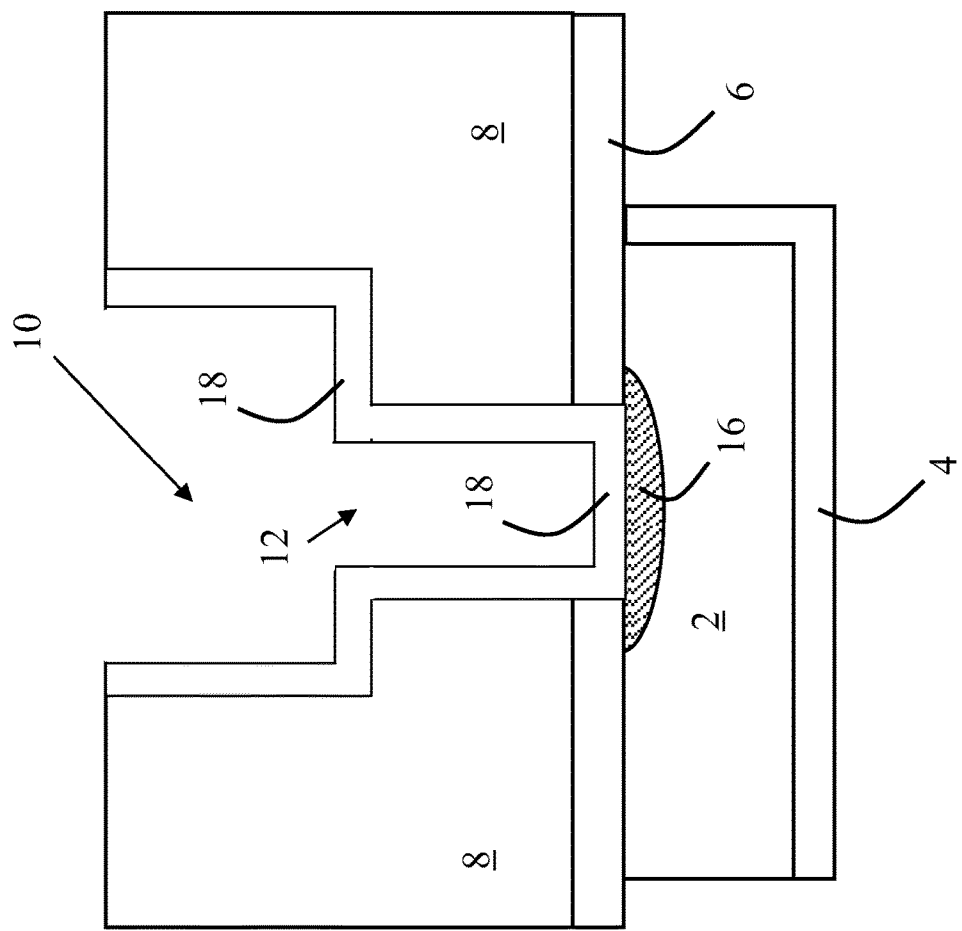
FIG. 4 shows a schematic cross-sectional depiction of a structure undergoing a process according to various embodiments.

FIG. 4 illustrates an additional process according to various embodiments, including depositing a cobalt layer 18 to cover the bottom of the via opening 12 over electrolessly plated metal layer 16, and sidewalls 20 of via opening 12. Cobalt layer 18 can be deposited via any conventional deposition techniques known in the art, for example, chemical vapor deposition (CVD). In some cases, cobalt layer 18 can further be deposited (e.g., during the same CVD process) over a bottom 24 of trench 10 and sidewalls 26 of the trench 10.

Figure 5:
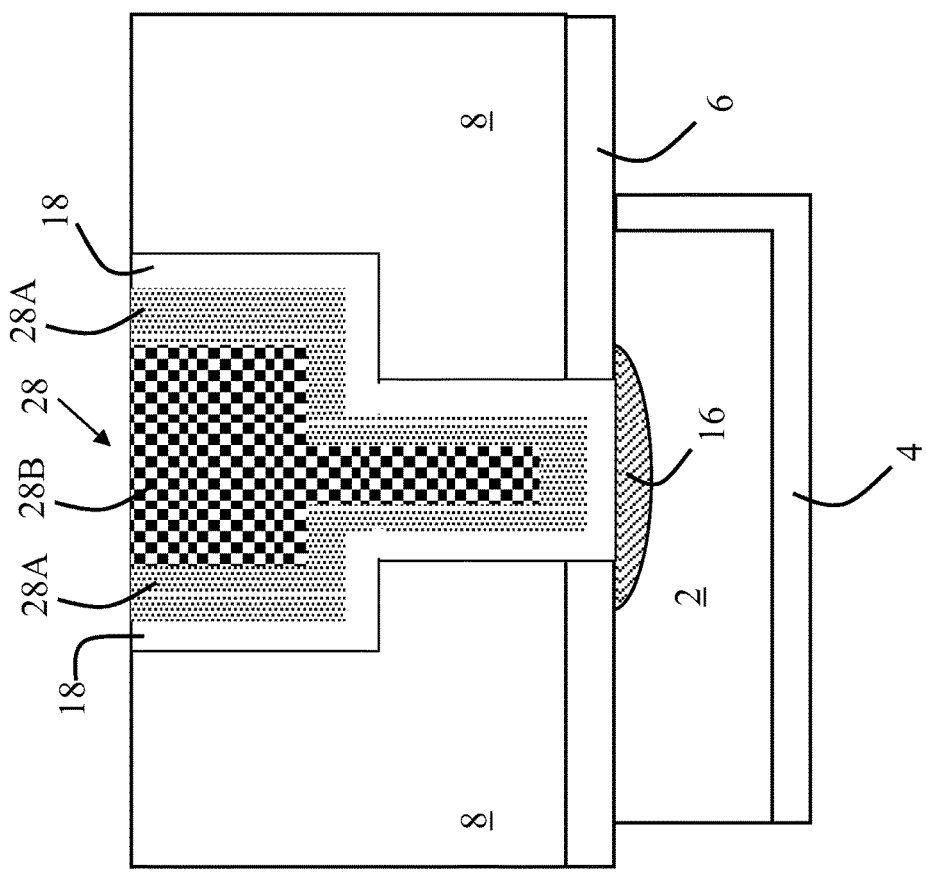
FIG. 5 shows a schematic cross-sectional depiction of a structure undergoing a process according to various embodiments.

FIG. 5 illustrates an additional process according to various embodiments, including growing a Cu layer 28 over cobalt layer 18 to form a line 30 (FIG. 6) within the trench 10 (trench shown in phantom) and a via 32 (FIG. 6) filling the via opening 12 (opening shown in phantom). Cu layer 28 can be plated according to conventional seed/plate damascene processes (e.g., PVD Cu or PVD a Cu alloy (such as manganese (Mn) aluminum (Al), etc.). In particular, seed layer 28A can be seeded/plated over cobalt layer 18 to form Cu growth layer 28B.

Figure 5B:
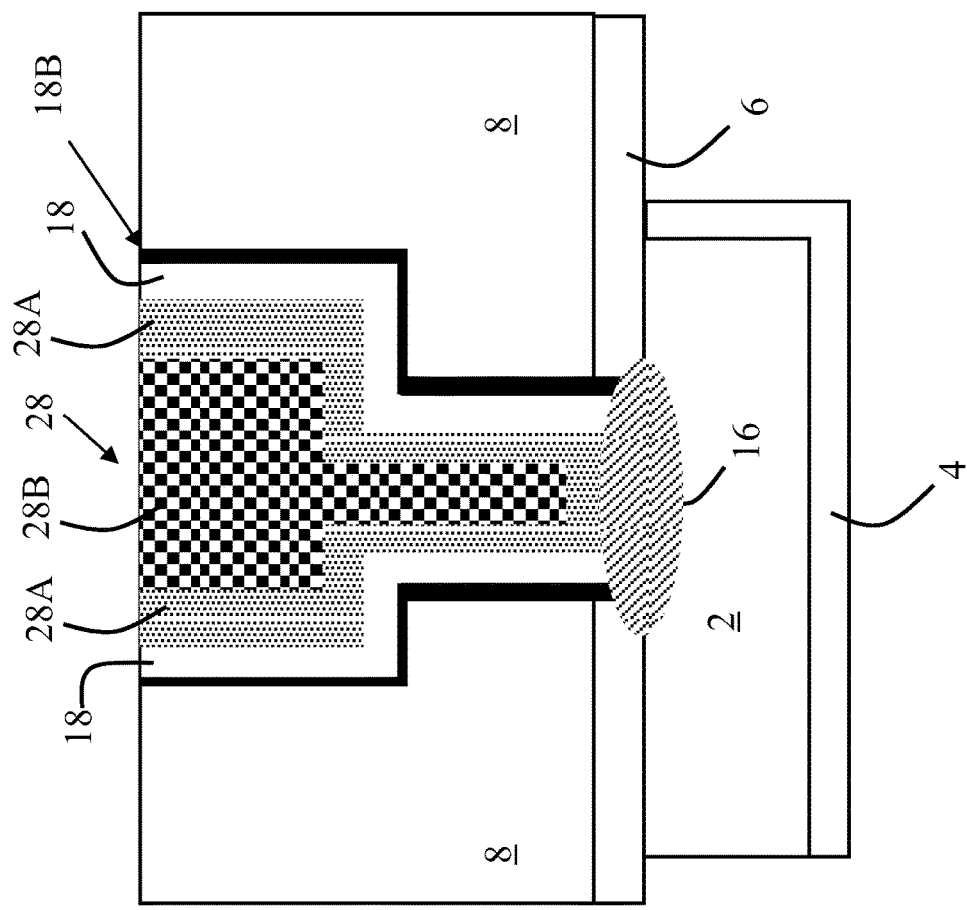
FIG. 5B shows a schematic cross-sectional depiction of an alternative process in forming a structure according to various embodiments.

FIG. 5B shows an alternative embodiment, in which seed layer 28A includes CuMn. In this embodiment, a tantalum-containing layer (Ta or TaN) 18B is formed prior to cobalt layer 18 (e.g., via deposition techniques described herein).

Figure 6:
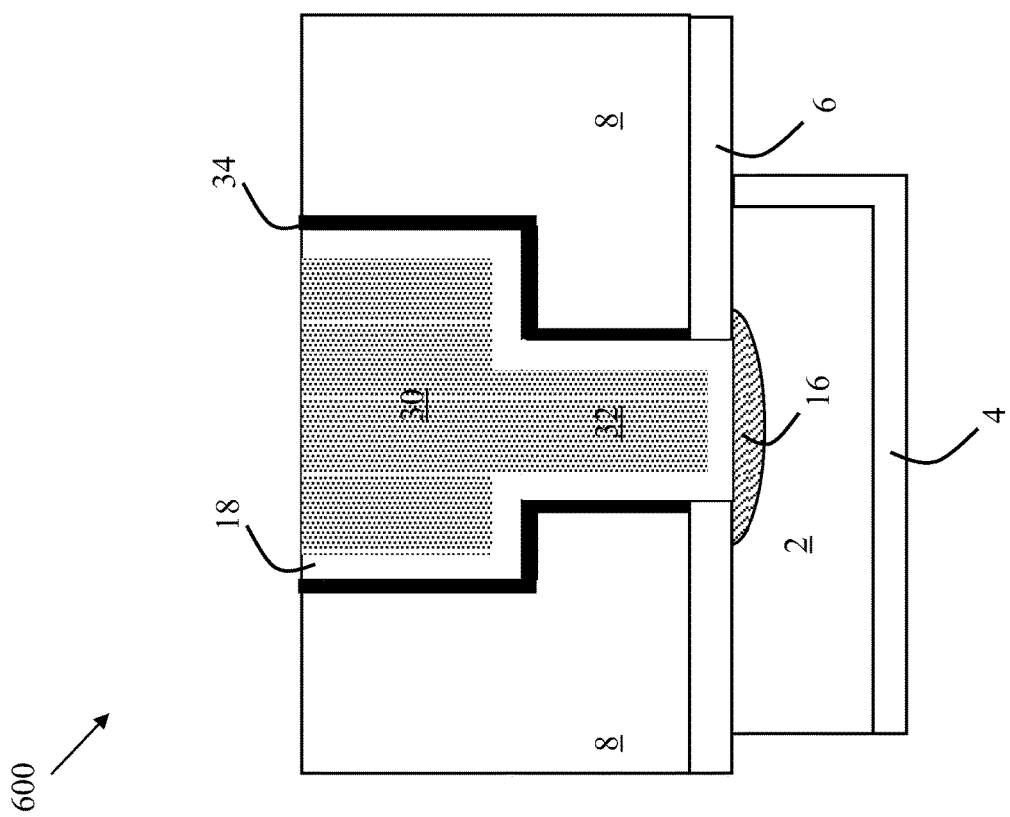
FIG. 6 shows a schematic cross-sectional depiction of an integrated circuit (IC) structure according to various embodiments.

FIG. 6 illustrates an additional process according to various embodiments, including annealing the precursor structure of FIG. 5 after growing Cu layer 28, forming an IC structure 600 including line 30 and via 32. As shown, annealing promotes diffusion of Mn atoms from the (CuMn) seed layer 28A through cobalt layer 18. Mn atoms, which diffuse through cobalt (or Ru) layer 18, react with oxygen and silicon on the interface of low K dielectric layer 8 and the cobalt layer 18 to form an oxide liner 34 (including, e.g., $MnSiO_3$).

Figure 6B:
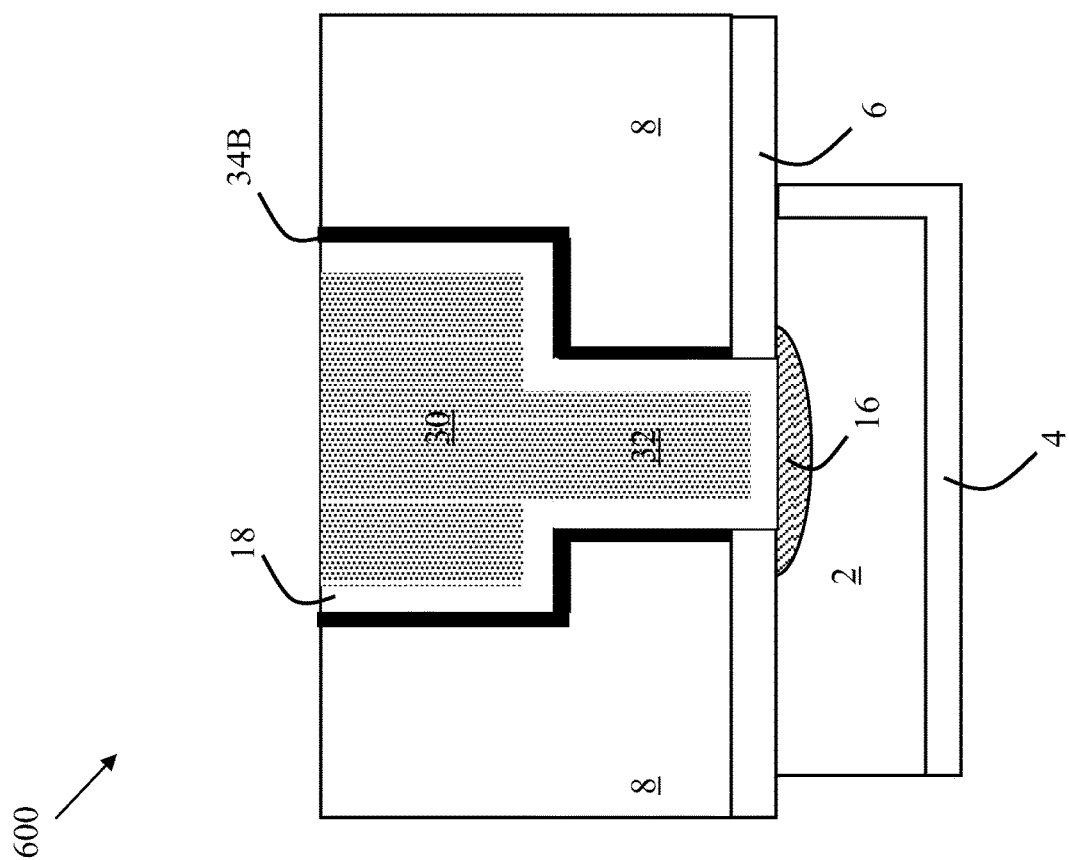
FIG. 6B shows a schematic cross-sectional depiction of an alternative process following the process described with respect to FIG. 5B, according to various embodiments.

FIG. 6B shows the results of the alternative process described with respect to FIG. 5B, whereby annealing causes Mn atoms diffuse from seed layer 28A (where seed layer include CuMn) through cobalt layer (or ruthenium layer) 18. In this annealing process, Mn atoms which diffuse through the cobalt layer (or ruthenium layer) 18 react with tantalum-containing layer (Ta or TaN) 18B and oxygen to form a manganese silicate ($MnSiO_3$) layer 34B.

Figure 7:
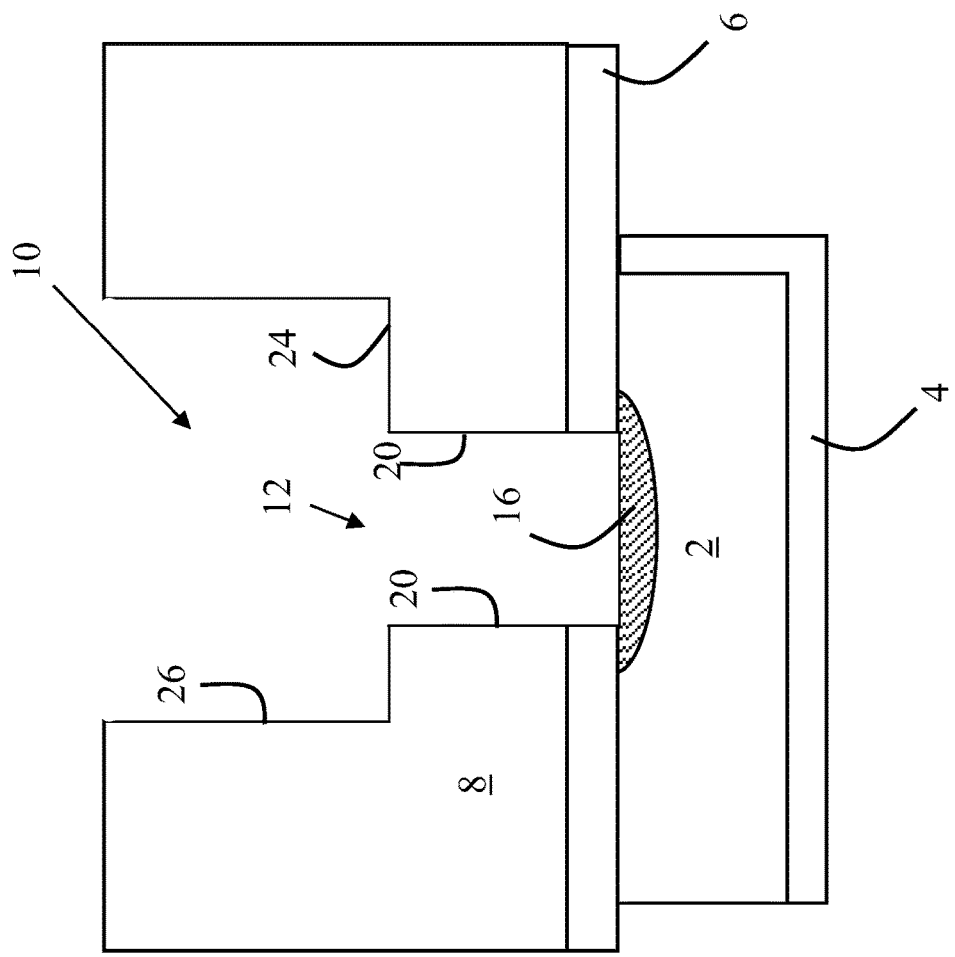
FIG. 7 shows a schematic cross-sectional depiction of a structure undergoing a process according to various additional embodiments.
Figure 8:
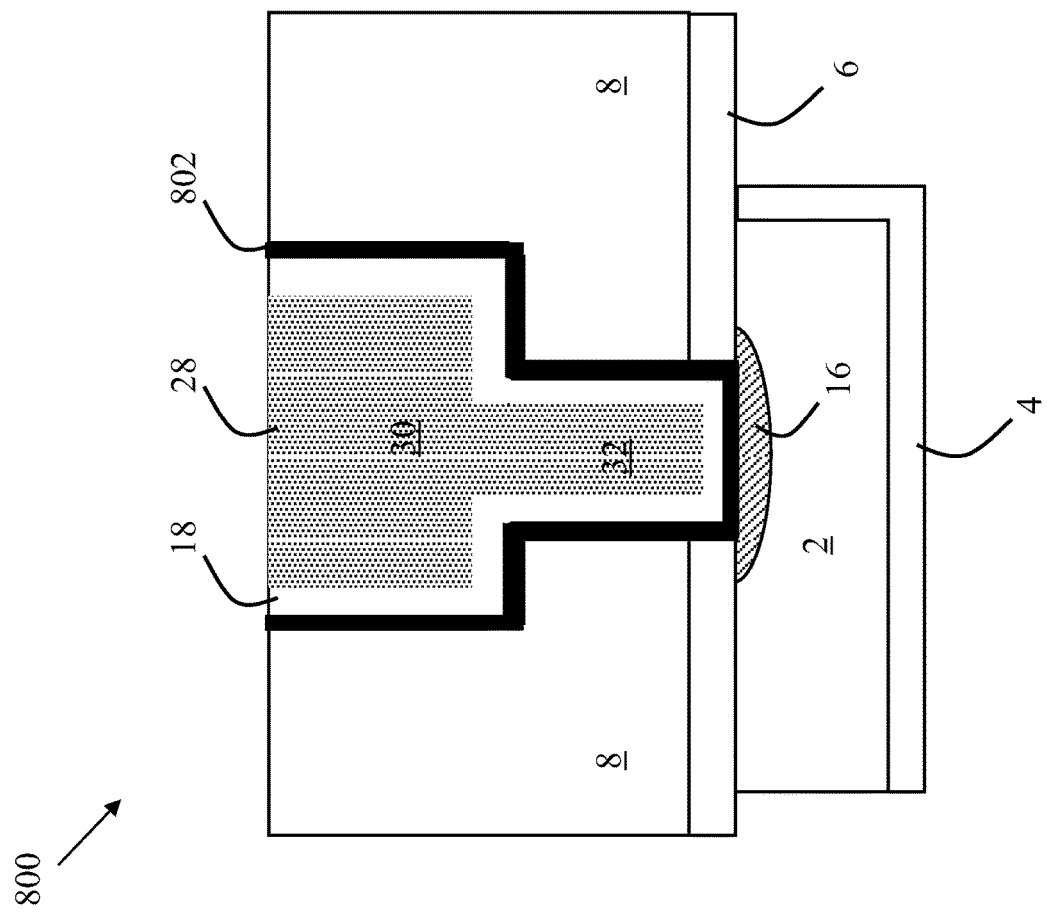
FIG. 8 shows a schematic cross-sectional depiction of an integrated circuit (IC) structure according to various additional embodiments.

FIG. 7 is a reproduction of FIG. 3, which demonstrates a precursor structure after formation of via opening 12. Following the process shown in FIG. 7 (and described with respect to FIG. 3), an alternative method according to various embodiments is illustrated in the cross-sectional depiction of an IC structure 800 in FIG. 8, which can include depositing a diffusion barrier layer 802 to cover the bottom of via opening 12, over electrolessly plated metal layer 16 and sidewalls 20 of via opening 12, prior to forming cobalt layer 18 and Cu layer 28. In some cases, diffusion barrier layer 802 is formed over bottom 24 and sidewalls 26 of trench 10. In various embodiments, diffusion barrier layer 802 includes, e.g., TaN, Ta, TiN, Ti, Co, or Ru, which may be formed by conventional physical vapor deposition (PVD) techniques, or TaN deposited using conventional atomic layer deposition (ALD) techniques, or $MnSiO_3$ or tantalum manganese oxide ($TaMn_xO_y$) using CVD or ALD.

Figure 9:
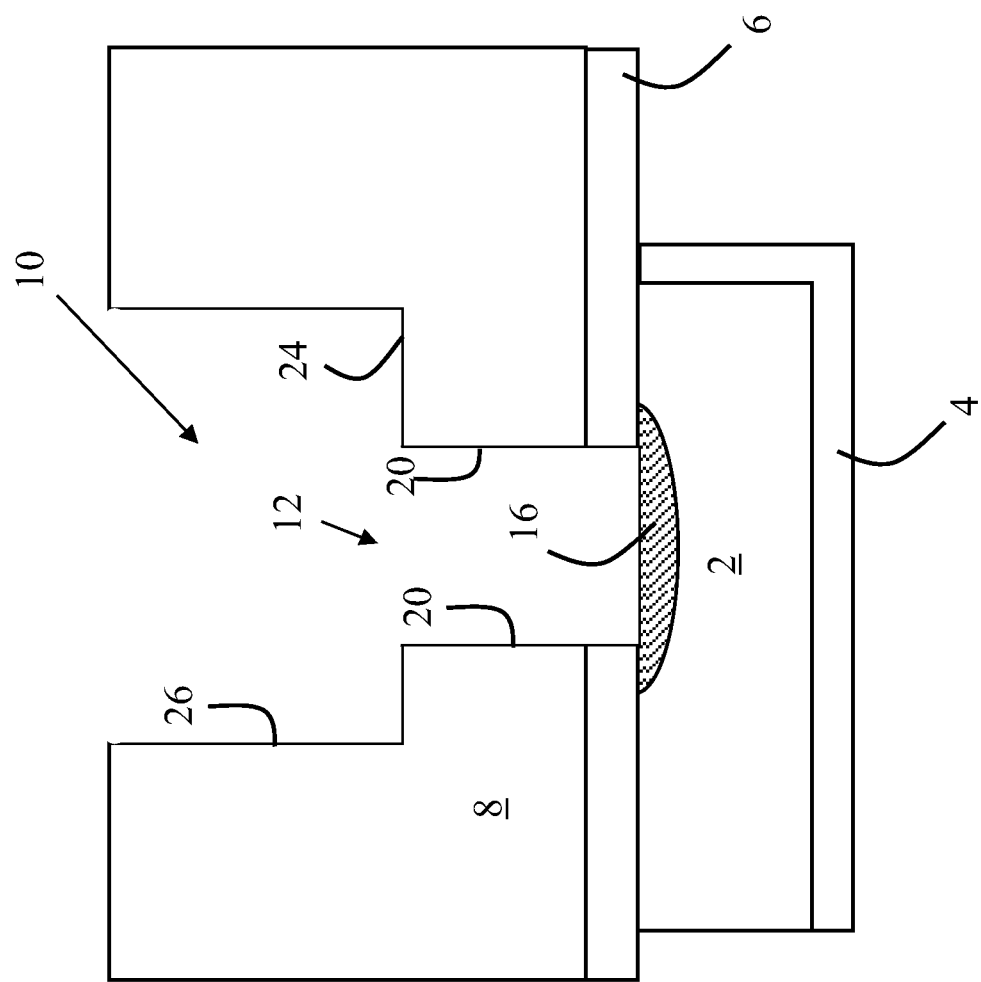
FIG. 9 shows a schematic cross-sectional depiction of a structure undergoing a process according to various other embodiments.
Figure 10:
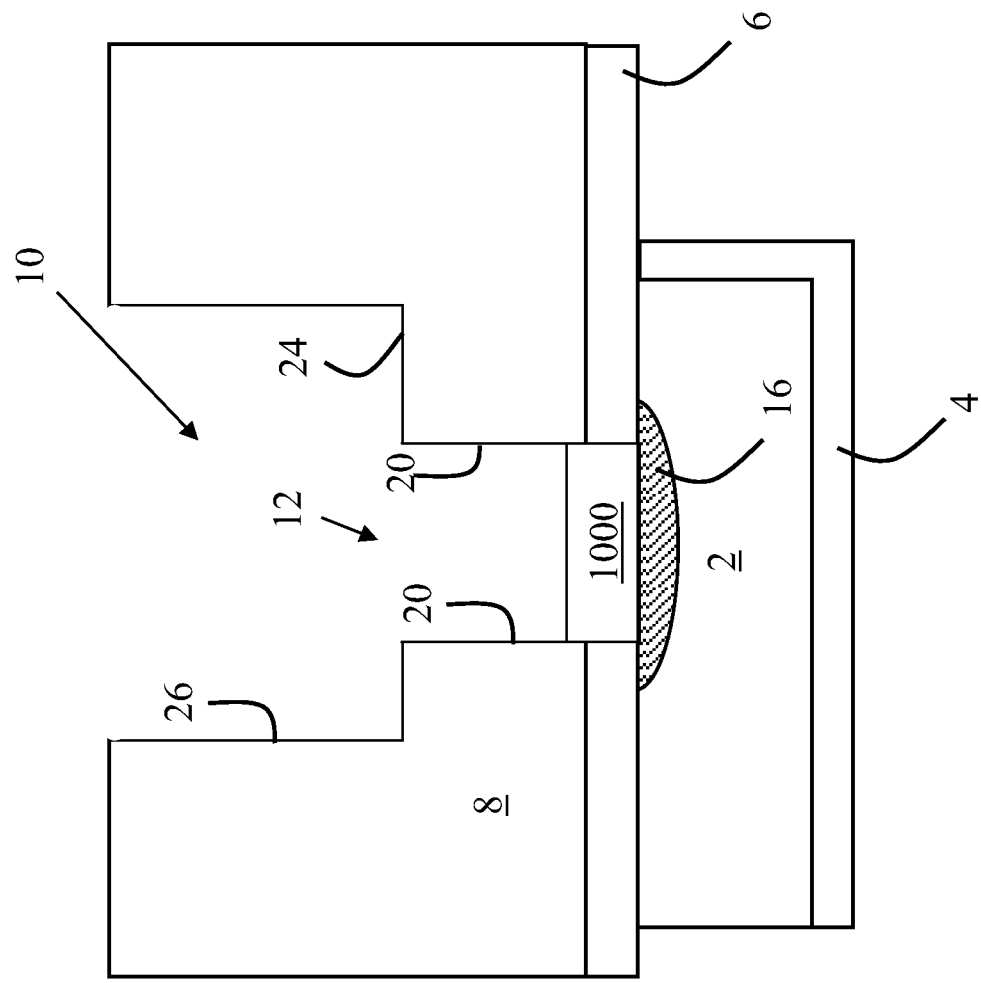
FIG. 10 shows a schematic cross-sectional depiction of a structure undergoing a process according to various other embodiments.

FIGS. 9-13 illustrate processes in an additional method according to various embodiments. FIG. 9 is a reproduction of FIG. 3 (and FIG. 7), which demonstrates a precursor structure after formation of via opening 12. Following the process shown in FIG. 9 (and described with respect to FIG. 3), an alternative method according to various embodiments is illustrated in FIG. 10, including depositing an additional metal layer 1000 over electrolessly plated metal layer 16 at the bottom of via opening 12. Additional metal layer 1000 can be include alloys of nickel (Ni) or Co, and can be either selectively deposited (e.g., in the case of Co), or electrolessly deposited (e.g., in the cases of either Ni or Co).

Figure 11:
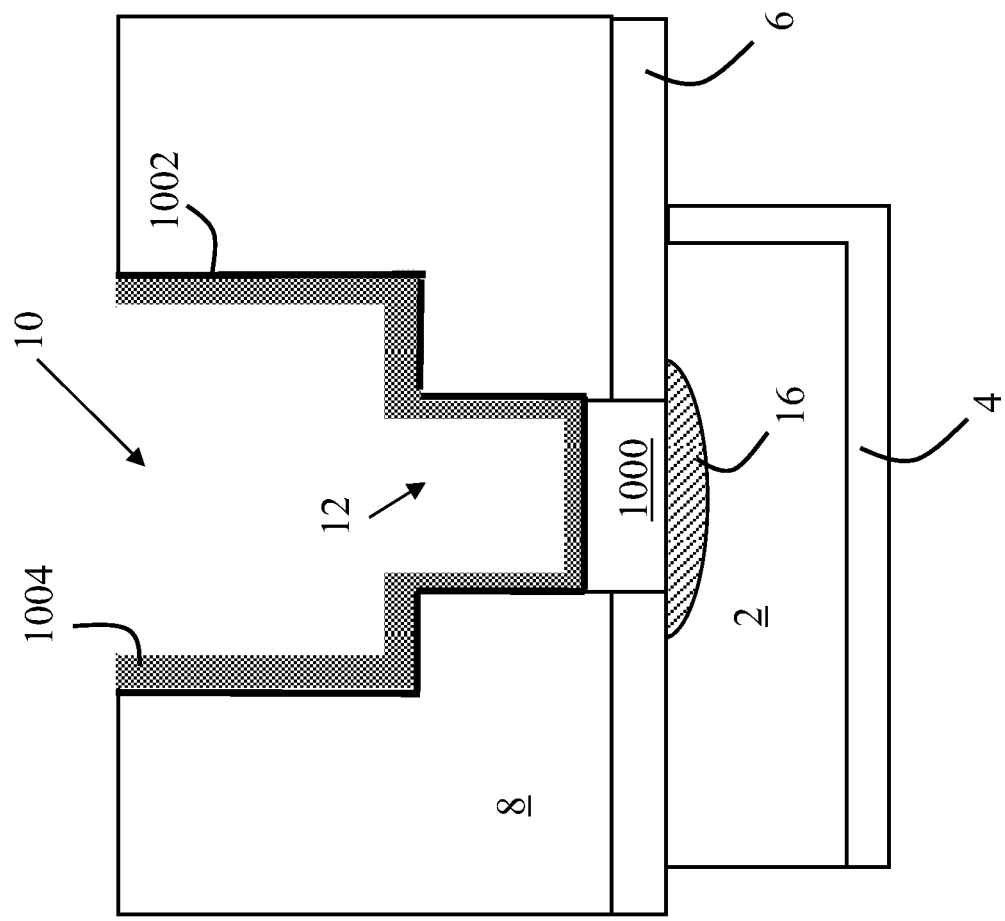
FIG. 11 shows a schematic cross-sectional depiction of a structure undergoing a process according to various other embodiments.

FIG. 11 shows an additional process following formation of additional metal layer 1000, including depositing a barrier layer 1002 (e.g., TaN, Ta, TiN, Ti, Co, Ru, $MnSiO_3$ or $TaMn_xO_y$, which may be formed by conventional physical vapor deposition (PVD) techniques, or TaN deposited using conventional atomic layer deposition (ALD) techniques) over metal layer 1000, bottom 24 and sidewalls 26 of trench 10, and sidewalls 20 of via opening 12. FIG. 11 also shows a process of forming a copper seed layer 1004 over barrier layer 1002, in a similar manner as shown and described with respect to FIG. 5.

Figure 12:
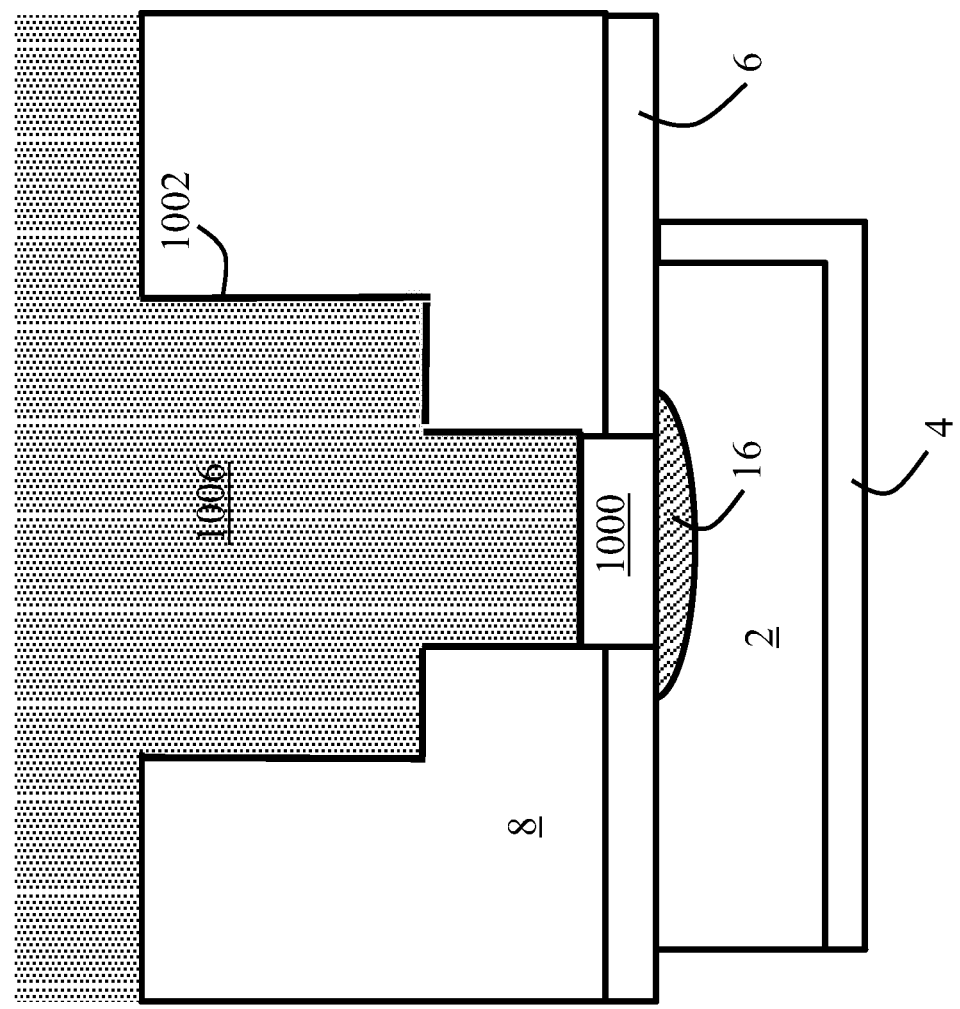
FIG. 12 shows a schematic cross-sectional depiction of a structure undergoing a process according to various other embodiments.

As shown in FIG. 12, after copper seed layer 1004 is deposited, a plated copper layer 1006 can be formed to fill a remainder of via opening 12 and trench 10 not filled by barrier layer 1002. Plated copper layer 1006 can be formed over the upper surface of low K dielectric layer 8, e.g., via conventional plating deposition techniques known in the art.

Figure 13:
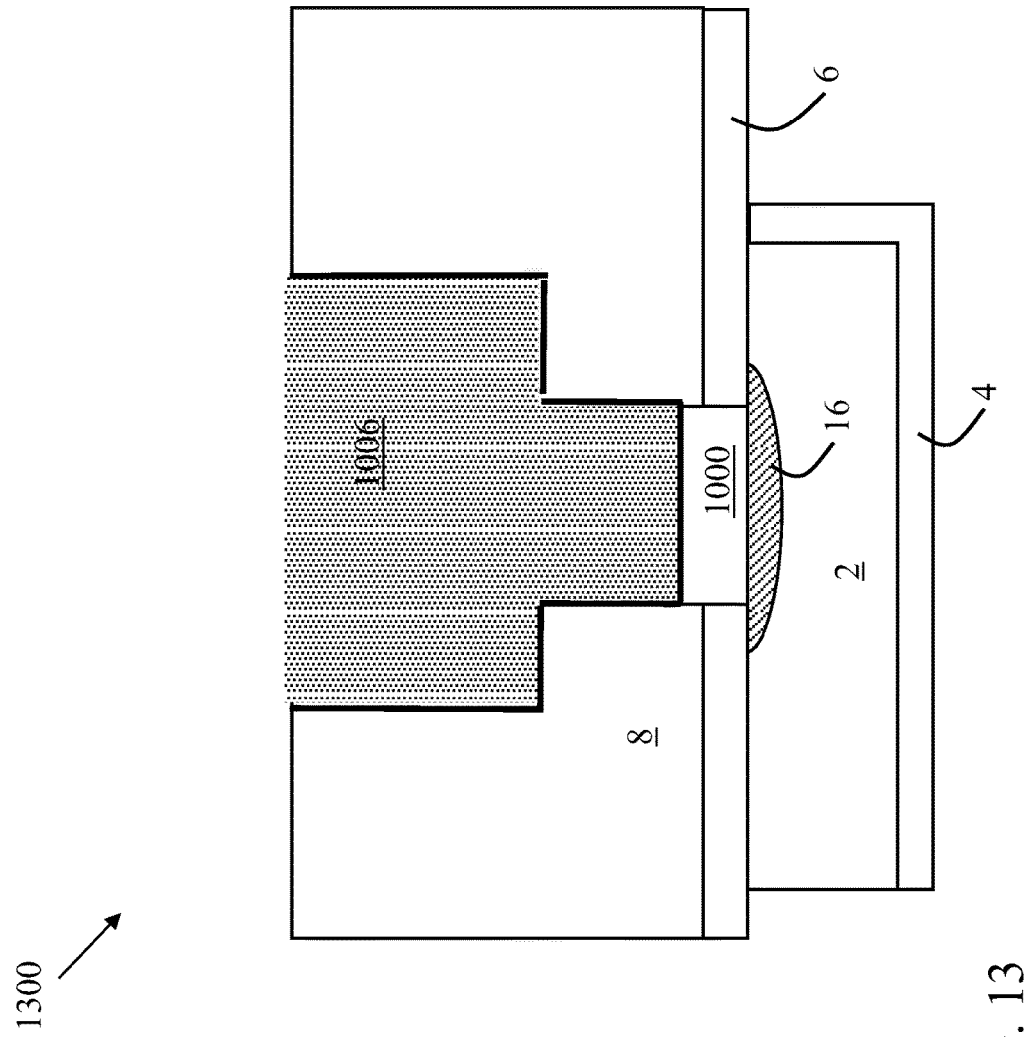
FIG. 13 shows a schematic cross-sectional depiction of an integrated circuit (IC) structure according to various other embodiments.

FIG. 13 illustrates an additional process in forming an IC structure 1300, after forming plated copper 1006, including annealing the precursor structure (shown in FIG. 12) and performing chemical-mechanical planarization (CMP) over the plated copper 1006 overlying the upper surface of low K dielectric layer 8.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method comprising:
    forming a via opening through a trench to expose a portion of an underlying metal line;
    electrolessly plating a metal layer at a bottom of the via opening over the exposed portion of the underlying metal line, the electrolessly plated metal layer formed of a metal not including copper;
    depositing a cobalt layer to cover the bottom of the via opening over the electrolessly plated metal layer and sidewalls of the via opening;

electrolessly depositing an additional metal layer over the electrolessly plated metal layer at the bottom of the via opening prior to the depositing of the cobalt layer, wherein the additional metal layer includes nickel, cobalt, or alloys of nickel and cobalt;

growing a copper layer over the cobalt layer to form a line within the trench and a via filling the via opening; and annealing the trench and the via opening after the growing of the copper layer.

2. The method of claim 1, wherein the depositing of the cobalt layer includes forming the cobalt layer by chemical vapor deposition over the electrolessly plated metal layer and the sidewalls of the via opening.

3. The method of claim 2, wherein the cobalt layer is further formed over a bottom of the trench, and sidewalls of the trench.

4. The method of claim 3, further comprising, prior to the depositing of the cobalt layer, forming a tantalum-containing layer over the sidewalls of the via opening and the sidewalls of the trench.

5. The method of claim 1, wherein the underlying metal line includes copper (Cu).

6. The method of claim 5, wherein the electrolessly plating of the metal layer at the bottom of the via opening includes electrolessly plating the metal layer only over the exposed portion of the underlying metal line.

7. The method of claim 6, wherein the electrolessly plated metal layer includes metal atoms from at least one of gold (Ag), platinum (Pt), Ruthenium (Ru), tin (Sn), palladium (Pd), rhodium (Rh), iridium (Ir), indium (In), osmium (Os) or rhenium (Re).

8. The method of claim 7, wherein the metal atoms of the electrolessly plated metal layer have an ionization tendency below an ionization tendency of Cu, whereby the electrolessly plated metal layer is formed over the exposed portion of the underlying metal line including Cu by electron transfer from the Cu to the electrolessly plated metal layer.

9. The method of claim 8, wherein the electron transfer from the Cu to the electrolessly plated metal layer results in a selective deposition of the electrolessly plated metal layer over only the Cu.

10. A method comprising:

forming a via opening through a trench to expose a portion of an underlying metal line;

electrolessly plating a metal layer at a bottom of the via opening only over the exposed portion of the underlying metal line, the electrolessly plated metal layer formed of a metal not including copper;

electrolessly depositing an additional metal layer over the electrolessly plated metal layer at the bottom of the via opening, wherein the additional metal layer includes nickel, cobalt, or alloys of nickel and cobalt;

depositing a diffusion barrier layer to cover the bottom of the via opening over the additional metal layer and sidewalls of the via opening; and growing a copper layer over the diffusion barrier layer to form a line within the trench and a via filling the via opening.

11. The method of claim 10, wherein the diffusion barrier layer is further formed over a bottom of the trench, and sidewalls of the trench, and wherein the diffusion barrier layer includes tantalum nitride (TaN), tantalum (Ta), titanium nitride (TiN), titanium (Ti), cobalt (Co), ruthenium (Ru), manganese silicate ($MnSiO_3$) or tantalum manganese oxide ($TaMn_xO_y$).

12. The method of claim 10, wherein the underlying metal line includes copper (Cu).

13. The method of claim 10, wherein the electrolessly plated metal layer includes metal atoms from at least one of gold (Ag), platinum (Pt), Ruthenium (Ru), tin (Sn), palladium (Pd), rhodium (Rh), iridium (Ir), indium (In), osmium (Os) or rhenium (Re).

14. The method of claim 13, wherein the metal atoms of the electrolessly plated metal layer have an ionization tendency below an ionization tendency of Cu, whereby the electrolessly plated metal layer is formed over the exposed portion of the underlying metal line including Cu by electron transfer from the Cu to the electrolessly plated metal layer.

15. The method of claim 14, wherein the electron transfer from the Cu to the electrolessly plated metal layer results in a selective deposition of the electrolessly plated metal layer over only the Cu.

16. An integrated circuit (IC) structure comprising:

a liner layer including silicon;

a copper wire within the liner layer;

a dielectric layer over the copper wire and the liner layer;

a wire within the dielectric layer;

a via extending between the wire and the copper wire within the dielectric layer, the via having a lining along corresponding sidewalls;

an electrolessly plated barrier layer proximate a bottom of the via contacting only an exposed portion of the copper wire within the liner layer, the electrolessly plated barrier layer including metal ions from at least one of gold (Ag), platinum (Pt), Ruthenium (Ru), tin (Sn), palladium (Pd), rhodium (Rh), iridium (Ir), indium (In), osmium (Os) or rhenium (Re); and an electroless metal layer over the electrolessly plated barrier layer proximate the bottom of the via, wherein the electroless metal layer includes nickel, cobalt, or alloys of nickel and cobalt.

17. The IC structure of claim 16, wherein the electrolessly plated barrier layer is located below the dielectric layer, and wherein at least a portion of the electrolessly plated barrier layer is located below a portion of the copper wire within the liner layer.

* * * * *